United States Patent [19]
Wheeler et al.

[11] Patent Number: 5,985,492
[45] Date of Patent: Nov. 16, 1999

[54] MULTI-PHASE MASK

[75] Inventors: Donald C. Wheeler, Beacon; Jack A. Mandelman, Stormville; Rebecca D. Mih, Wappingers Falls, all of N.Y.

[73] Assignee: International Business Machines Corporation, Armonk, N.Y.

[21] Appl. No.: 09/010,611

[22] Filed: Jan. 22, 1998

[51] Int. Cl.[6] .......................................................... G03F 9/00
[52] U.S. Cl. .................................................. 430/5; 430/323
[58] Field of Search ............................... 430/5, 311, 313, 430/322, 323

[56] References Cited

U.S. PATENT DOCUMENTS

| | | |
|---|---|---|
| 5,300,786 | 4/1994 | Brunner et al. . |
| 5,308,722 | 5/1994 | Nistler ........................................ 430/5 |
| 5,368,963 | 11/1994 | Hanyu et al. . |
| 5,370,975 | 12/1994 | Nakatani . |
| 5,382,484 | 1/1995 | Hosono . |
| 5,443,931 | 8/1995 | Watanabe . |
| 5,543,254 | 8/1996 | Kim et al. .................................... 430/5 |
| 5,547,789 | 8/1996 | Nakatani et al. . |

*Primary Examiner*—S. Rosasco
*Attorney, Agent, or Firm*—DeLio & Peterson, LLC; John J. Tomaszewski; Tiffany L. Townsend

[57] ABSTRACT

A photomask and a method for using the photomask to make dimensionally controlled resist patterns are provided. A wafer having a resist coating thereon is exposed using the mask of the invention under specially controlled defocus conditions to provide the dimensionally controlled resist pattern profile. The mask which comprises multiple phase shifter means on one side of at least one of the light shielding patterns on the mask provides light passing through the mask having multiple phases on that side of the light shielding material which produces a dimensionally controlled resist pattern profile.

17 Claims, 3 Drawing Sheets

MULTI-PHASE MASK

BACKGROUND OF THE INVENTION

1. Field of the Invention

This invention relates to a method for the manufacture of electronic components such as integrated circuit wafers using photoresists and an imaging system and, more particularly, to an exposure mask for use in a photoresist imaging system wherein the mask employs multiple degrees of phase shifting across the mask depending on the pattern to be formed and to a method for using the mask to form resist patterns on electronic component substrates.

2. Description of Related Art

In electronic component manufacture and in particular integrated circuit silicon wafer manufacturing, the key factor in delineating small patterns in the wafer is the shape of the resist pattern. The following description will be directed to integrated circuit silicon wafer manufacture but it will be appreciated by those skilled in the art that the invention may be applied to the manufacture of other electronic components such as gallium arsenide circuits, component packages and printed circuit boards.

In the manufacture of integrated circuit components such as semiconductors, electronic circuit pattern control, e.g., linewidth control, pad size, etc. is becoming increasingly important because of even higher integration of the circuits and the linewidth and other circuit patterns are required to be increasingly fine and precise. Pattern control in photolithographic processes, however, is negatively impacted by numerous effects ranging from resist thickness variations, bake non-uniformities, non-flat wafers, etc.

Photolithography techniques are preferably used to form the fine resist pattern to define the circuit. In general, a resist is applied to a wafer at a predetermined thickness and the coated wafer is positioned on a wafer stage. Light from a light source passes through a photomask having a predetermined mask (circuit) pattern thereon. The light passing through the photomask forms an aerial image which is projected onto the resist on the wafer forming the mask pattern on the resist. The resists are typically negative resists or positive resists and the exposed resist is then processed using a number of cleaning, developing and etching steps to form a pattern on the wafer either in the form of openings in the resist which are to be metallized to form the desired circuit pattern (negative resist) or in the form of a positive resist pattern delineating the desired pattern on the wafer surface to be metallized. The above photolithographic process is shown in U.S. Pat. No. 5,300,786 which is assigned to the assignee of the present invention.

In either of the negative or positive resist methods or combination resist methods (e.g., image reversal resists), it is necessary that a photomask be used to form the pattern on the resist and, traditionally, the imaging process using optical lithography creates a plurality of resist patterns which are each, in cross-section, of substantially constant width, height and symmetry. Under some exposure conditions, the width of the resist pattern may vary somewhat with the height of the resist with the size and configuration of the pattern and with the width at the base being generally slightly wider than the width at the top of the resist. In any event, the resist pattern is still substantially symmetrical and a metallized circuit line would be of essentially constant cross-section measured about a vertical axis extending upward from the midpoint of the base of the resist pattern.

There are many different integrated circuit manufacturing processes that require an asymmetric resist pattern or control of the pattern as part of the process to provide desired circuit designs, and one application, for example, is to produce a pattern for lift off processes. These methods are well known in the art.

A number of attempts have been made to create an asymmetrical resist (photoresist) profile or pattern. In U.S. Pat. No. 5,547,789 to Nakatani et al. an asymmetrical light intensity profile is used to pattern a positive resist, which resist is then converted by flood illumination into a negative resist (image reversal resist) in order to affect the placement of subsequently formed gate electrodes. The purpose of the asymmetry of the resist pattern is to create an asymmetrical placement of the gate electrode. The asymmetrical intensity profile is achieved by a pattern transfer mask comprised of a transfer substrate, a linear light shielding film pattern disposed on the transparent substrate, and a means for reducing the intensity of light transmitted through a part of the mask on either side of the light shielding film pattern. The pattern transfer mask comprises a transparent substrate having different kinds of light attenuating films placed on the transparent substrate next to the light shielding pattern such as an opaque material, a light shielding film with different thicknesses or a semi-transparent film. The resist profiles shown are strongly re-entrant on both sides of the pattern which is not acceptable for many manufacturing methods.

Another patent which shows an asymmetrical light intensity profile is U.S. Pat. No. 5,370,975 to Nakatani wherein the mask designed to create the asymmetrical light profile employs a phase shifter with an edge angle ranging from 70°–85° or 95°–110° or the phase shifter is shaped to be smoothly curved. In U.S. Pat. No. 5,300,786, supra, there is a description of a phase shift mask which can shift the intensity profile of the light for the purpose of determining and controlling the focus settings of an optical lithography exposure system. When there is a change in focus, the minimum point of the intensity profile is shifted to create an asymmetrical displacement of the photoresist pattern to the left or right direction. The intensity profile is asymmetric about the minimum intensity peak point and it is the asymmetric peak shift which creates a pattern placement error which is used in conjunction with other reeference patterns to measure the focus as an overlay by an automated overlay error measurement tool.

In U.S. Pat. No. 5,368,963 to Hanyu et al. a photomask is shown comprising a light shielding layer formed on a mask substrate and light transmission areas defined on the mask substrate by the light shielding areas. The light transmitting areas are divided with phase shifters.

The above patents are hereby incorporated by reference.

Bearing in mind the problems and deficiencies of the prior art, it is therefore an object of the present invention to provide a photomask for use in an imaging system for making circuits on electronic components including integrated circuit wafers whereby the image formed on photoresists used in the wafer manufacturing process can be controlled during the manufacturing process depending on the pattern to be formed. The resist pattern is generally asymmetric about a vertical axis extending from the midpoint of the base upward through the resist.

It is a further object of the present invention to provide a method for making electronic components including integrated circuit wafers wherein the resist patterns formed thereon during the manufacturing process can be controlled depending on the pattern to be formed. The resist pattern is generally asymmetric about a vertical axis extending from the midpoint of the base upward through the resist pattern.

Another object of the invention is to provide electronic components including integrated circuit wafers made using the method and photomask of the invention.

Still other objects and advantages of the invention will in part be obvious and will in part be apparent from the specification.

SUMMARY OF THE INVENTION

The above and other objects, which will be apparent to those skilled in art, are achieved in the present invention which is directed in a first aspect to a photomask for use in an imaging system whereby light is passed through the mask and impinges on a photoresist covered substrate to form dimensionally controlled resist patterns on the substrate such as an electronic component, e.g., an integrated circuit wafer, the mask comprising:

a mask substrate which allows light to pass therethrough;

a light shielding material on the mask substrate in the form of a plurality of lines and other circuitry forming shapes forming a pattern which defines the desired resist pattern to be formed on the photoresist coated on the mask substrate; and multiple phase shifter means on one side of at least one of the light shielding shapes so that light passing through the mask has multiple phases on the side of the shape having the multiple light phase shifting means the multiple phase shifting means being in the form of a phase shifter material on the mask substrate and/or which means is a part of the substrate.

The multiple phase shifter means is preferably contiguous with the side of the light shielding material pattern and whereby light passing through the mask substrate has at least two different phases on each side of the light shielding material pattern. It is preferred that at least one of the multiple phases of light on the one side of the light shielding means be out of phase with the light on the other side of the light shielding means by other than 0° or 180° or in multiples thereof. It is further preferred that the light passing through the mask be out of focus with the resist.

In another aspect of the invention using a preferred mask of the invention, a method is provided for fabricating an electronic component such as an integrated circuit wafer which component has a dimensionally controlled asymmetric resist pattern formed on the component during the fabrication process and wherein the electronic component substrate, e.g., wafer, is coated with a photoresist (e.g., negative, positive, or image reversal photoresist) and exposed to light traveling through a mask having the desired circuit pattern thereon, the method comprising:

coating the electronic component substrate, e.g., silicon wafer, with a photoresist material;

positioning the substrate on a holding, e.g., stepping, device;

positioning a mask so that light impinging on one surface of the mask travels through the mask and impinges on the coated substrate to form an image of the mask design in the photoresist material, the mask comprising:

a mask substrate which allows light to pass therethrough;

a light shielding material on the mask substrate in the form of lines and other circuitry forming shapes forming a pattern which defines the resist pattern to be formed in the resist on the coated substrate; and multiple phase shifter means on the substrate on one side of at least one of the light shielding shapes so that light passing through the mask has multiple phases on the side of the shape having the multiple light phase shifting means, the multiple phase shifter means being in the form of a phase shifter material or which means is a part of the substrate;

exposing the mask to light;

developing the exposed substrate to form the desired resist pattern on the substrate; and forming the desired electronic component.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
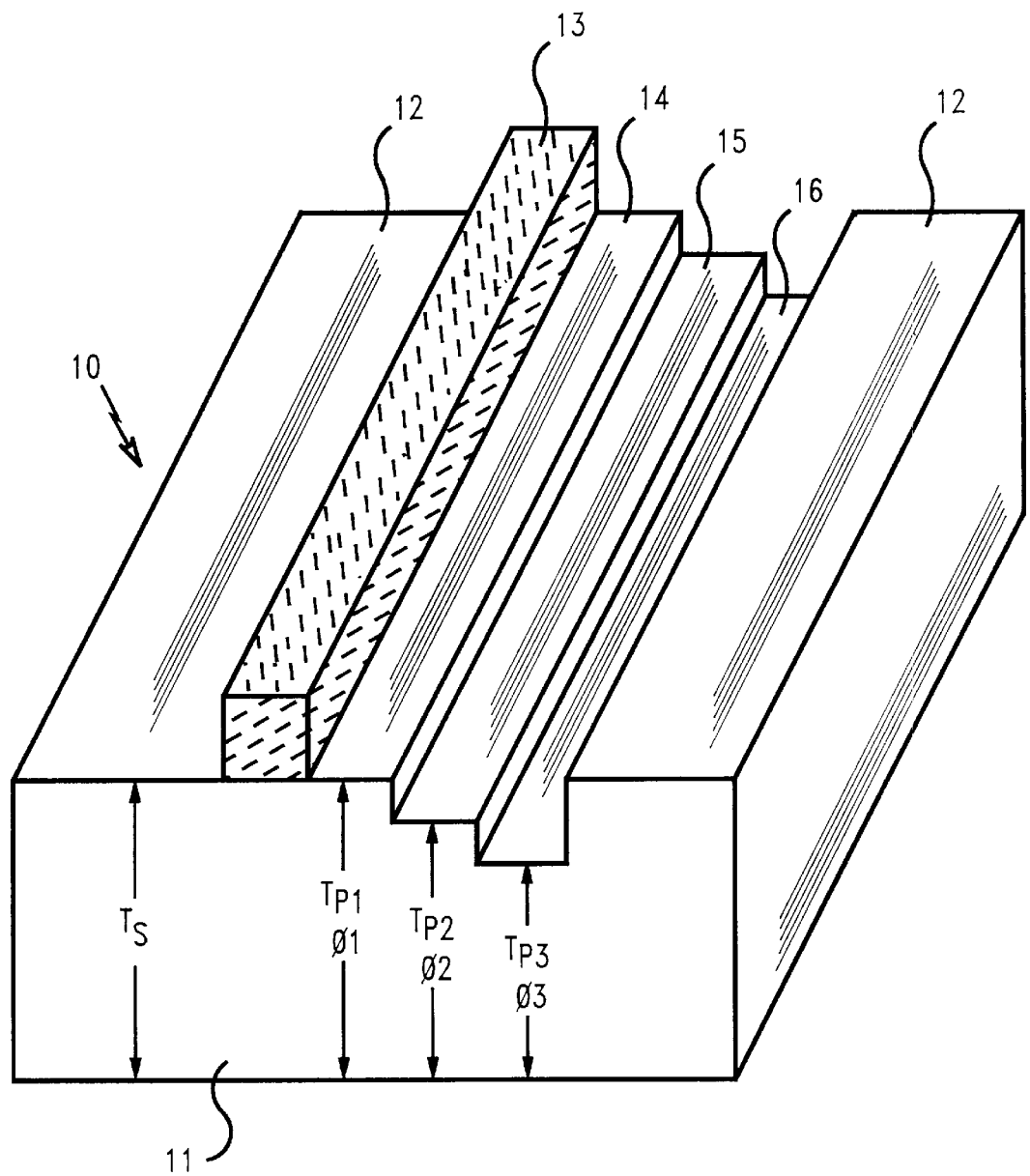
FIG. 1 shows a perspective view of a photomask of the invention having a single line and multiple light phase shift means thereon.

In describing the preferred embodiments of the present invention, reference will be made herein to FIGS. 1–5 of the drawings in which like numerals refer to like features of the invention. Features of the invention are not necessarily shown to scale in the drawings.

The masks of the present invention can be used in any optical lithography system which systems are well-known in the art. The systems may also be termed projection imaginary systems and a typical system is described in U.S. Pat. No. 5,300,786, supra, where a photolithography mask structure having a novel optical focus test pattern is used to project test patterns on a resist coated semiconductor. Basically, these systems utilize an illumination source typically comprising a mirror, an arc lamp, a light filter and a condenser lens system. The illumination source outputs "light" to a mask structure which is pre-patterned as desired, e.g., to project a wiring level of an integrated circuit under fabrication. As used herein, the term "light" refers to light used in photolithography. The terms "light" and "photolithography" in the specification need not be restricted to visible light but can also embrace other forms of radiation and lithography. Light passing through the mask structure typically intersects a reduction lens which focuses the mask pattern into particular lens fields fabricated on the semiconductor wafer. The wafer is held in position by a vacuum hold device (or chuck), the position of which is controlled by an accurate X,Y,Z location controller or stepper motor.

Focus is typically quantified as an offset error in the location of the wafer in the Z dimension relative to a perfectly focused image plane. For purposes of the subject invention, the image plane can be at any point, e.g., typically either the top of the resist material or the base of the resist material or any point in between. The image plane may also be above the top of the resist or below the base of the resist.

The focus offset or defocus as discussed hereinbelow, has either a positive or a negative Z displacement with respect to the ideal focal image plane along with a magnitude representative of the distance by which the image plane is out of focus. The vacuum hold device will typically be adjusted to provide the desired defocus to perform the method of the present invention. Another projection exposure apparatus which is generally used for pattern formation using a mask is shown in FIG. 9 of U.S. Pat. No. 5,370,975, supra.

To determine the best defocus to use to make the desired dimensionally controlled resist pattern, it is preferred to use a defocus matrix test procedure as part of the electronic component manufacturing process. Thus, a wafer having multiple chips thereon is coated with the photoresist, each chip exposed using a different defocus condition, then baked and developed using typical procedures. Each chip cross-section is then viewed across the resist sidewall with a scanning electron microscope (SEM) to determine the best defocus condition. For example, if the wafer has ten (10) chips, the defocus for each chip could be made to vary in the following sequence: −1.0 μm, −0.8 μm, −0.6 μm, −0.4 μm, −0.2 μm, 0 μm, +0.2 μm, +0.4 μm, +0.6 μm, +0.8 μm. Other sequences could be used depending on the manufacturing process.

Referring to FIG. 1, a mask of the invention is shown generally as 10. The mask 10 comprises a transparent substrate 11 having a thickness $T_s$. The substrate 11 has light shielding material 13 thereon in the form of a single line. Contiguous with the light shielding material 13 on one side thereof is a multiple phase shifting means. As shown, the thickness of substrate 11 as represented by $T_{p1}$, $T_{p2}$ and $T_{p3}$. $T_{p1}$ is the same as $T_s$ and therefore, the thickness of the substrate $T_s$ is the same as the thickness of the substrate at plane or ledge 14 ($T_{p1}$) and light transmitted through mask 10 has the same phase on each side 12 and 14 of light shielding material 13. Contiguous with area 14 is a first channel 15 which is shown having a height $TP_2$. Similarly, contiguous with first channel 15 is second channel 16 which is shown having length $T_{p3}$. Depending on the heights $TP_1$, $TP_2$ and $T_{p3}$, the phase shift of the light passing therethrough is defined. The phase shift angles are defined as φ1, φ2 and φ3. The phase shift angles may be any angle and may vary widely, e.g., 10°, 30°, 45°, 90°, 120°, 150°, 163°, or any other suitable phase shift angle.

Figure 2:
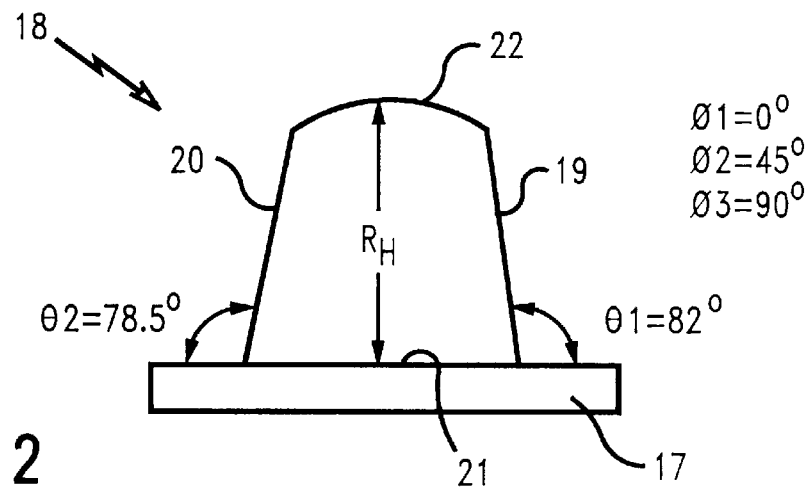
FIGS. 2, 3 and 4 show cross-sectional side views of a positive resist on a substrate having dimensionally controlled patterns made using the mask and method of the invention.
Figure 3:
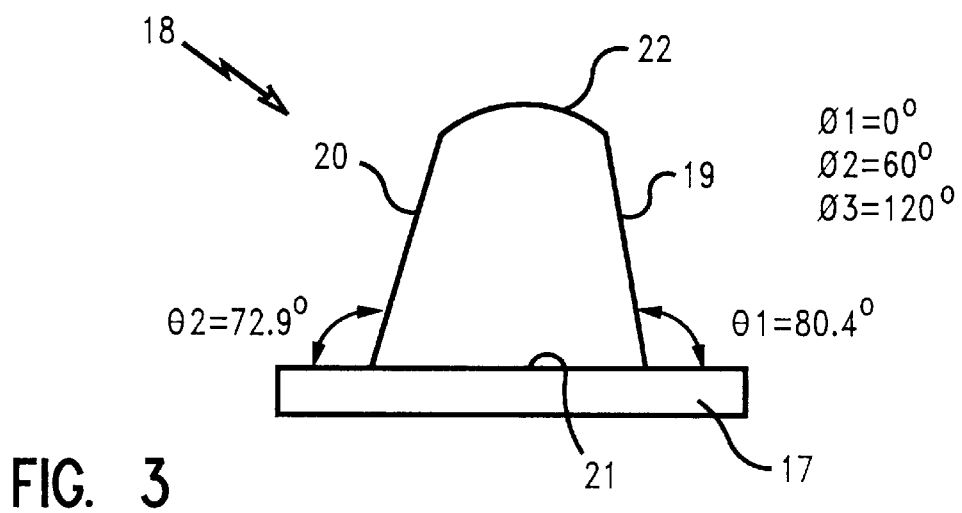
Figure 4:
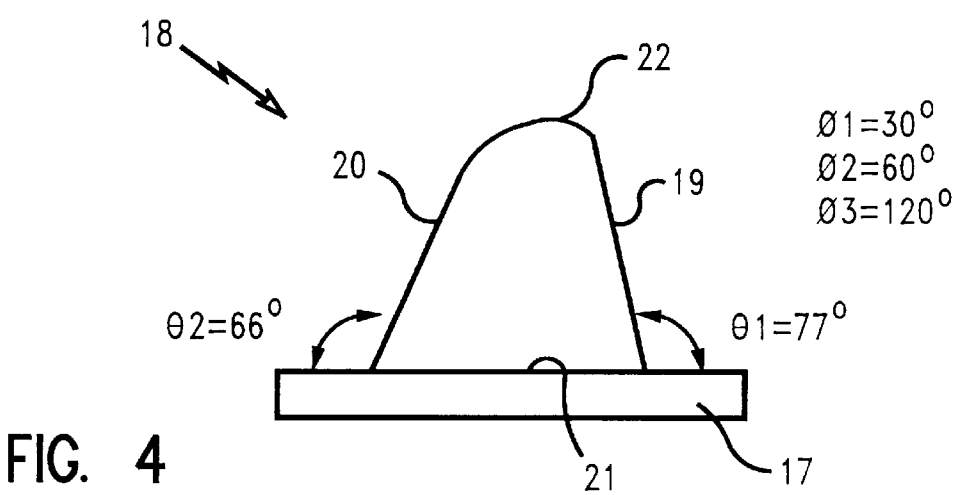

As is well-known in the art, light exposure conditions, the type resist, bake and develop and reflection from the wafer surface will affect the shape of the resist pattern but, in any event, the resist will be substantially symmetric. Using the mask and method of the invention, however, a resist pattern as shown in FIGS. 2, 3 and 4 having a dimensionally controlled shape may be formed. Accordingly, with reference to FIG. 2, a substrate 17 is completely coated with a photoresist (not shown), exposed and developed to form a resist pattern 18 having sidewalls 19 and 20, a base 21 and top 22. The formed resist pattern 18 has sidewall angles θ1=82° and θ2=78.50°. The mask of FIG. 1 was used to form the resist pattern wherein φ1=0°; φ2=45°; and φ3=90°. The resist 17 has a height $R_H$ and is asymmetric since the base angle θ1 is greater than θ2.

Referring to FIG. 3, a resist pattern was formed using the same procedure as for FIG. 2 except that the phase shift angles of the photomask are φ1=0°; φ2=60°; and φ3=120°. θ1 for the resist pattern 18 is now 80.4° and θ2 is 72.9°. Similarly, in FIG. 4, when the phase shift angles for the photomask are φ1=30°; φ2=60°; and φ3=120°; θ1 is 77° and θ2 is 66°.

Referring again to FIG. 1, a typical mask 10 of the invention is shown. The transparent material 11 may be any suitable transparent material such as glass, calcium fluoride and fused silica and is typically fused silica. The thickness of the substrate $T_s$ will generally be about 90 mils to 300 mils. It is preferred to form the phase shift of the light passing through the mask by employing channels such as 15 and 16 in the substrate 11 which channels effect a phase shift of the light by its travel through a different substrate thickness ($T_s$ versus $TP_2$ and $TP_3$). The necessary thickness for a desired phase shift can be easily determined. The difference between the phases of the light passing through the mask substrate at 12 and the opposed side shown as 14, 15 and 16 of light shielding material 13 must be other than 0° or 180°, or multiples thereof for at least one and preferably two or more of the light phases.

The light shielding material 13 may be any suitable material such as molybdenum silicide and chrome and is typically chrome which is applied using conventional means such as sputtering or metal evaporation, preferably sputtering. The thickness of the light shielding material may vary widely and is generally about 50 nm to 150 nm. The purpose of the light shielding material 13 is to prevent light from passing through the mask onto the resist coated substrate being imaged where the material 13 is present.

Referring again to FIGS. 2, 3 and 4, the substrate 17 is typically silicon or other semiconductor material and the resist material may be any photoresist such as a negative resist or a positive resist. While any resist may be used, it is preferred that the resolution of the resist be a medium or high resolution resist as is well-known in the art.

It is an important feature of the invention that the resist, thickness of the resist, the difference in the multiple phases of the light on each side of the light shielding material, the focus and light exposure dose during exposure be specially controlled either singly or preferably in combination to provide the desired dimensionally controlled resist patterns of the invention. Each of the above parameters may be varied independently but are all preferably controlled within certain ranges to provide enhanced resist patterning results.

Any resist thickness (as shown as $R_H$ in FIG. 2) may be employed, but it is preferred that greater thicknesses be used to provide a greater dimensionally controlled resist pattern effect. The resist thickness will generally be about 0.1 μm to 10 μm and is preferably about 0.4 μm to 2 μm. The defocus may also vary widely and is generally greater than the thickness of the resist, generally up to about ±10 μm and preferably about ±1 μm. Also preferred is a positive defocus rather than a negative defocus. The exposure dose is important and is generally chosen to be such that the width of the printed line is substantially equal to the width of the corresponding mask pattern. For example, for a 5 x stepper, a 2.0 μm mask feature will print a 0.4 μm width line. This is conventionally called "dose to size" and preferably, a dose of about 0.7 to 1.5 times the dose to size is preferred.

In a preferred embodiment, the illumination condition of the projection exposure tool should provide a coherency of about 0.25 to 0.8 preferably 0.6 or less.

Figure 5:
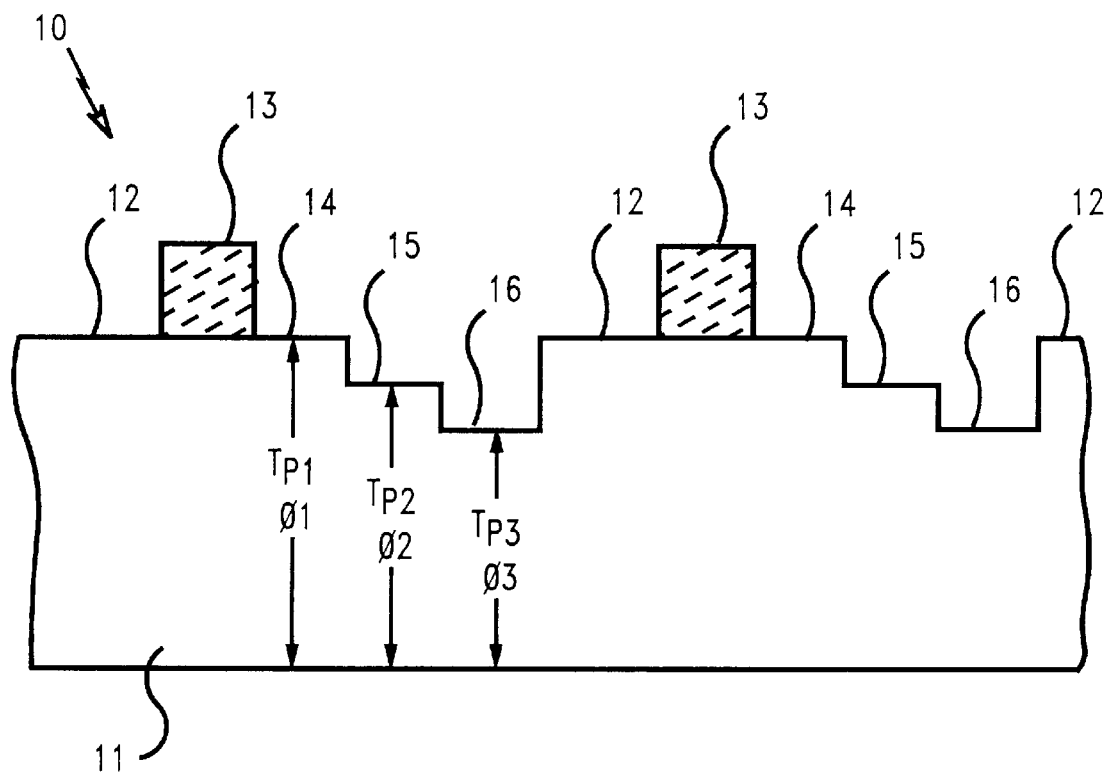
FIG. 5 is a cross-sectional side view of a mask such as shown in FIG. 1.

Referring to FIG. 5, a side view of a mask of the invention as shown in FIG. 1 is shown.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A photomask for use in an imaging system whereby light is passed through the mask and impinges on a photoresist covered substrate to form dimensionally controlled resist patterns on an electronic component substrate, the mask comprising:

a mask substrate which allows light to pass therethrough;

a light shielding material on the mask substrate in the form of lines and other circuitry forming shapes defining the desired resist pattern to be formed on the component substrate; and multiple light phase shifting means on one side of at least one of the light shielding means so that light passing through the mask has multiple phases on the side of the shape having the multiple light phase shifting means with at least one of the multiple phases of light being out of phase with the light on the other side of the light shielding means by other than 0° or 180°, or multiples thereof.

2. The photomask of claim 1 wherein the light shielding material is chrome.

3. The photomask of claim 1 wherein the multiple phase shifting means are channels in the mask substrate on one side of the light shielding means and contiguous with the light shielding means.

4. The photomask of claim 3 wherein the mask substrate is fused silica.

5. The photomask of claim 1 wherein the multiple light phase shifting means provides light being phase shifted by at least two of 30°, 45°, 60° and 120°.

6. The photomask of claim 5 wherein the photoresist is a negative or positive photoresist.

7. The photomask of claim 1 wherein the multiple light phase shifting means is a plurality of channels in the substrate.

8. The method of claim 7 wherein the multiple light phase shifting means provides light being phase shifted by at least two of 30°, 45°, 60° and 120°.

9. The method of claim 8 wherein light passing through the mask is out of focus with the photoresist.

10. An electronic component made according to the method of claim 9.

11. The method of claim 8 wherein the defocus is positive.

12. An electronic component made according to the method of claim 8.

13. The method of claim 7 wherein the light has a coherency of about 0.25 to 0.8.

14. An electronic component made according to the method of claim 13.

15. A method for fabricating an electronic component which component had a dimensionally controlled resist pattern formed on the component during the manufacturing process and wherein the electronic component substrate is coated with a photoresist and exposed to light traveling through a mask having the desired circuit pattern thereon, the method comprising:

coating the electronic component substrate with a photoresist material;

positioning the substrate on a holding device;

positioning a mask so that light impinging on one surface of the mask travels through the mask and impinges on the coated substrate to form an image of the mask design in the photoresist material, the mask comprising:

a mask substrate which allows light to pass therethrough;

a light shielding material on the mask substrate in the form of lines and other circuitry shapes forming a pattern which defines the resist pattern to be formed in the resist on the coated substrate; and multiple phase shifter means on the mask substrate on one side of at least one of the light shielding means so that light passing through the mask has multiple light phases on the side of the circuitry shape having the multiple light phase shifting means with at least one of the multiple phases of light being out of phase with the light on the other side of the light shielding means by other than 0° or 180° or multiples thereof;

exposing the mask to light;

developing the exposed substrate to form the desired resist pattern on the substrate; and forming the desired electronic component.

16. An electronic component made by the method of claim 15.

17. The electronic component of claim 16 wherein the electronic component is an integrated circuit chip.

* * * * *